(12) United States Patent
Ni

(10) Patent No.: US 6,687,867 B2
(45) Date of Patent: Feb. 3, 2004

(54) METHOD FOR TESTING A MEMORY ARRAY

(75) Inventor: Rong-Xiang Ni, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 440 days.

(21) Appl. No.: 09/731,687

(22) Filed: Dec. 5, 2000

(65) Prior Publication Data

US 2002/0069383 A1 Jun. 6, 2002

(51) Int. Cl.[7] ............................................... G01R 31/28
(52) U.S. Cl. ...................................................... 714/738
(58) Field of Search ............................... 714/720, 738; 365/201

(56) References Cited

U.S. PATENT DOCUMENTS 5,781,562 A * 7/1998 Saxena ........................ 714/738
6,061,817 A * 5/2000 Jones et al. .................. 714/738

* cited by examiner

*Primary Examiner*—Albert Decady
*Assistant Examiner*—Shelly A Chase
(74) *Attorney, Agent, or Firm*—Calfee, Halter & Griswold; Lois D. Cartier

(57) ABSTRACT

A method of generating a test bit pattern for a memory device is provided. The method includes, for example, the steps of loading a data register with an initial test bit pattern and storing the initial test bit pattern in the memory device. The method also includes the steps of generating a additional test bit patterns by shifting the initial test bit pattern by a predetermined number of bits and storing the additional test bit pattern in the memory device. The step of shifting the initial test bit pattern includes, for example, the step of pushing a one or two-bit pattern into the initial test bit pattern. Subsequent successive test bit patterns are similarly generated by pushing a one or two-bit pattern into the previously generated test bit patterns. Hence, the number of bits loaded into the data register is greatly reduced and the required test bit pattern still generated.

22 Claims, 11 Drawing Sheets

4096 Data Register Bits (2 memory rows)

2048 bits (row Y+1)  2048 bits (row Y)

METHOD FOR TESTING A MEMORY ARRAY

FIELD OF THE INVENTION

The invention relates generally to digital memory circuits and, more particularly, to the testing of configuration memories used for initializing Random Access Memory ("RAM") based programmable logic devices.

BACKGROUND OF THE INVENTION

Field programmable gate arrays ("FPGA") were first introduced by Xilinx, Inc. in 1985. An FPGA consists of cells that can be programmed to perform a variety of logical functions and programmable interconnects to connect the logic cells in a general way. The cells and interconnects are used to implement complex logical circuits. The use of FPGA's continues to grow at a rapid rate due to their relatively short design cycles, reduced cost through logic consolidation, and the flexibility offered by their re-programmability.

In this regard, Xilinx, Inc. has developed a family of in-system programmable ("ISP") configuration memories. Such configuration memories are used for the initialization logic of static random access memory (SRAM) based FPGA's such as, for example, the VIRTEX® AND SPARTAN® series of FPGA's manufactured by Xilinx, Inc. of San Jose, Calif. The initialization logic customizes the FPGA through configuration data that is loaded into internal memory cells. The advantage that ISP configuration memories offer is that they can be re-programmed "in-system" to accommodate last minute design changes and remote re-configurations without replacing or even removing the configuration memory from the system, which can be difficult and costly.

It is important that configuration memories, as well as other types of memory devices, be tested prior to shipment to ensure reliability. In this regard, the memories undergo a rigorous test regimen that seeks to verify the memory's functional operation. One disadvantage of such a test regimen is that it can be complicated, difficult, and time-consuming, if not impossible, to implement on standard testing equipment. This is especially true for high density memories that can store mega or even giga-bytes of information. This situation is further compounded if conventional test equipment is not available or not capable of testing the memory device.

Two examples of conventional test equipment include the Topaz engineering tester manufactured by HILEVEL Technology, Inc. and the HP Versatest V1100 manufactured by Hewlett Packard. The Topaz tester is a logic tester with a limited vector memory and the HP Versatest V1100 tester has an algorithmic pattern generator. In this regard, neither tester includes a built-in capability for generating appropriate test bit patterns for the testing of large memory arrays and their address decoder circuitry. Therefore, a method of testing memories devices that does not suffer from the aforementioned drawbacks is highly desirable.

SUMMARY OF THE INVENTION

According to one embodiment of the present invention, a method of loading a memory device with a test bit pattern is provided. The method includes, for example, the steps of loading a data register with a first test bit pattern and storing the first test bit pattern in the memory device. The method also includes the steps of generating a new test bit pattern by shifting the first test bit pattern by a predetermined number of bits and storing the new test bit pattern in the memory device. The step of shifting the first test bit pattern by a predetermined number of bits includes, for example, the step of pushing a one or two-bit pattern into the first test bit pattern. The remaining test bit patterns for the memory device are similarly generated by pushing a one or two-bit pattern into the previously generated test bit patterns. Each test bit pattern is stored in the memory device after it is generated until the entire memory device has been programmed with the appropriate test bit pattern. The memory of the memory device is then decoded or read to verify proper implementation of the test bit pattern.

According to another embodiment of the present invention, a method of loading a memory device having a plurality of memory cells organized by rows and columns with a test bit pattern is provided. The method includes, for example, the steps of generating a first test bit pattern by loading a data register with two rows of bit information and storing the first test bit pattern in two rows of the memory device. The method further includes the steps of generating a new test bit pattern for two additional rows by shifting the first test bit pattern by at least two bits within the data register, wherein the step of shifting includes pushing a two-bit pattern into the data register. Once the new test bit pattern is generated, it is stored in the two additional rows. The method continues to generate new test bit patterns for the remaining rows by continuing to shift the test bit pattern resident in the data register by at least two bits by pushing the same two-bit pattern into the data register.

Hence, it is an advantage of the present invention to provide a method of generating test bit patterns without having to individually load entire test bit patterns for each row of a memory array into a data register.

It is another advantage of the present invention to provide a method of generating test bit patterns for memory devices that employs looping logic that pushes a limited number of bits into an existing test bit pattern to create a new test bit pattern.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

DETAILED DESCRIPTION OF ILLUSTRATED EMBODIMENT

Figure 1:
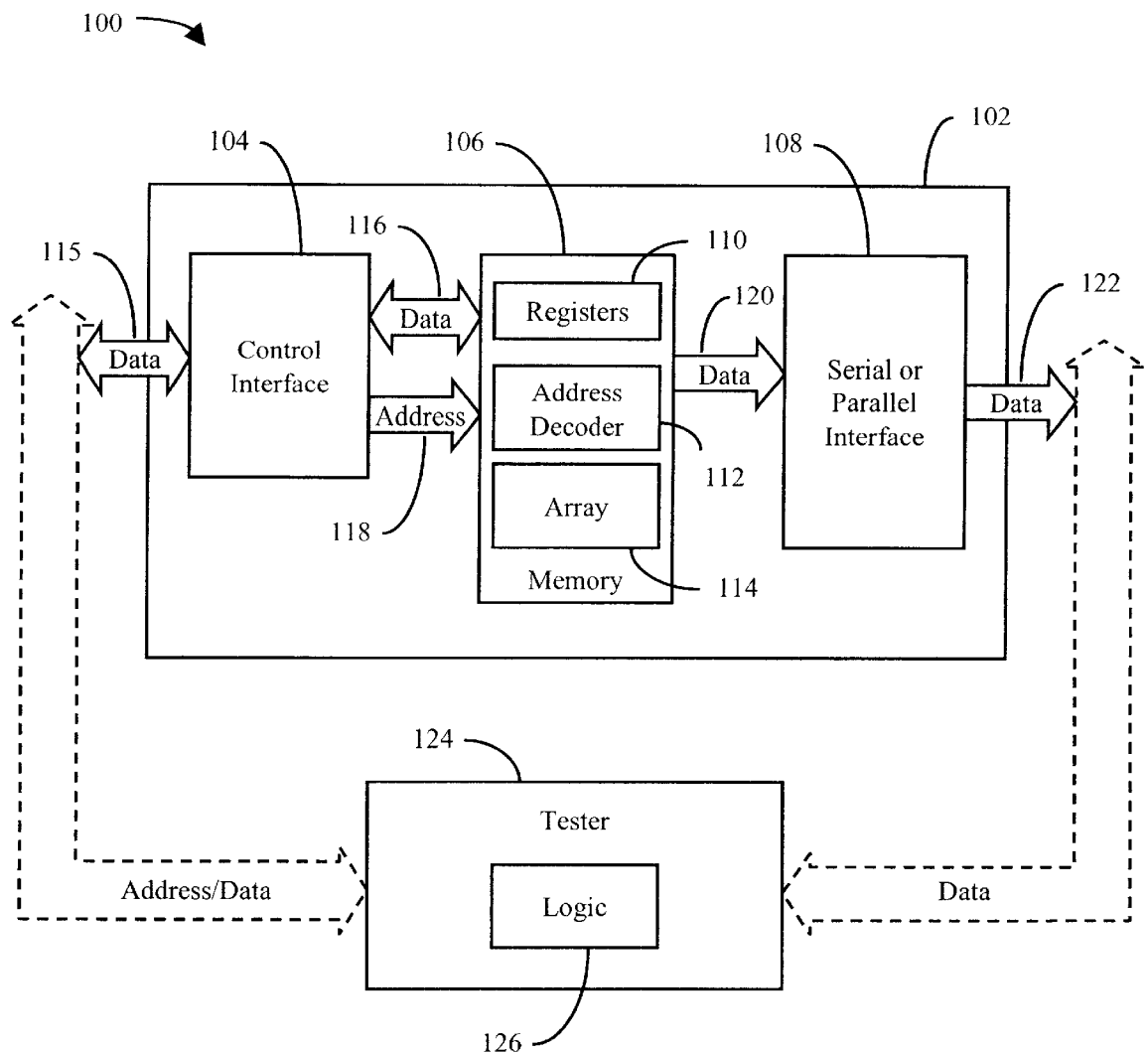
FIG. 1 is a general block diagram of a test system 100 of the present invention.

Illustrated in FIG. 1 is a test system 100 of the present invention. The system 100 has a memory device 102 and a tester 124. The memory 102 includes, for example, a control interface 104, a memory portion 106 and an output interface 108. The memory portion 106 includes a plurality of data registers 110, an address decoder 112 and an array portion 114. Information such as, for example, address information and data are transferred between these components via buses 115, 116, 118, 120, and 122. One such similar memory device is the XC18V00 series of in-system programmable configuration PROMs (Programmable Read-Only Memory) manufactured by Xilinx, Inc. of San Jose, Calif.

In general operation, memory 102 is programmed by inputting address and data information on buses 118 and 116, respectively, to memory portion 106. The address information is decoded by address decoder 112 into row and column information associated with array portion 114. The data is then input into data registers 110, which hold the data until it can be copied into array portion 114. As will be described in more detail below, data is input into data registers 110 by shifting or pushing the data bits into the registers in a bit-wise fashion. Additionally, once the data in data registers 110 is copied to their proper memory array location, the registers maintain the copied data until new data is shifted or pushed thereinto.

The tester 124 includes logic 126 for performing a memory test on memory device 102. As will be described in more detail below, logic 126 includes the steps executed by tester 124 to generate test bit patterns that are ultimately stored and read from array portion 114 to verify the operation of address decoder 112 and array portion 114. (See, for example, FIGS. 4A–4F, 5, 7A–7H, 8, 10A–10H, and 11.) One such tester 124 suitable for the present invention is aforementioned Topaz logic tester. Other testers can also be employed including the aforementioned HP Versatest V1100.

Figure 2:
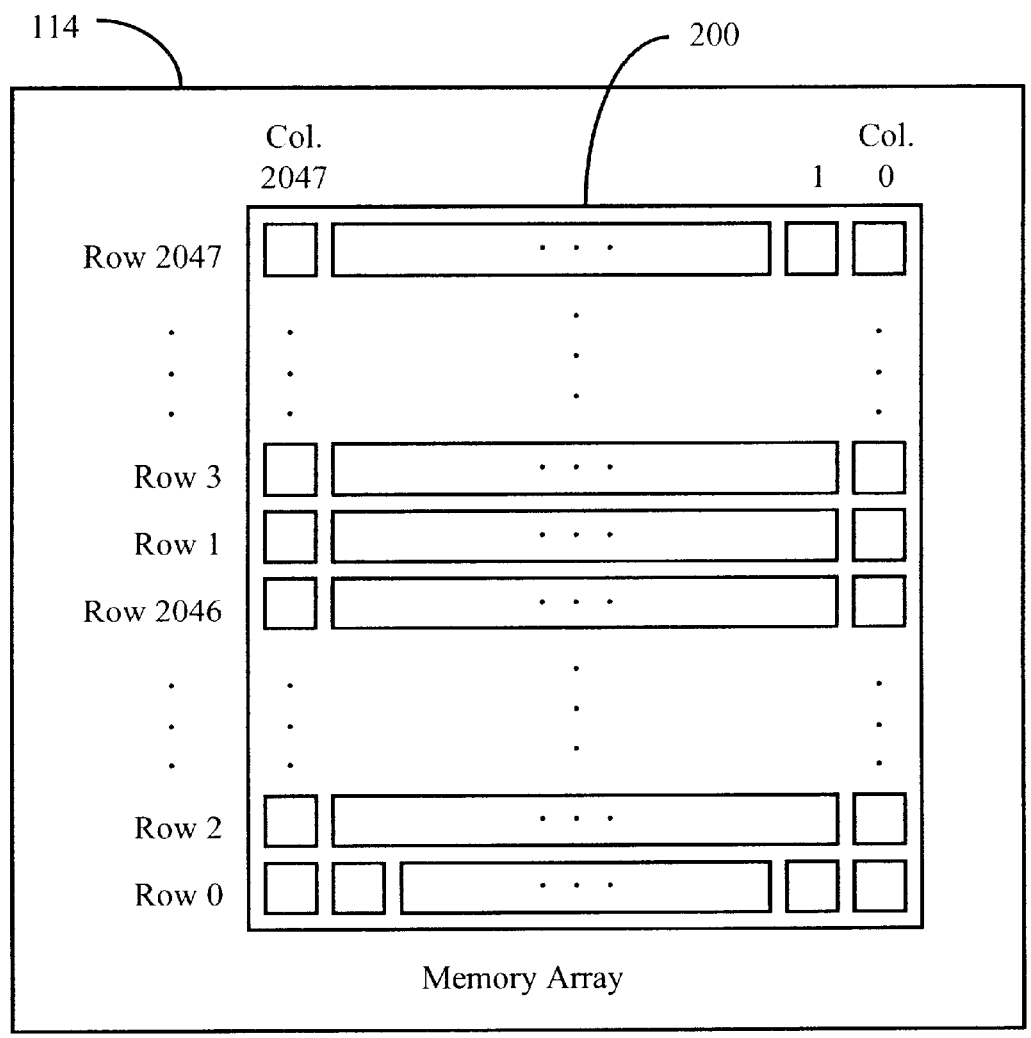
FIG. 2 is a block diagram of a memory array of the present invention.

Referring now to FIG. 2, array portion 114 is shown in greater detail. More specifically, array portion 114 has an array 200 of memory cells organized by rows and columns. The illustrated example has 2048 rows and 2048 columns equaling a total of 4,194,304 bits. Additionally, the illustrated array is organized such that even number rows (i.e., row 0, row 2, etc.) occupy a lower portion of the array 200 and odd number rows (i.e., row 1, row 3, etc.) occupy an upper portion. Moreover, the first column (column 0) occupies the right-most portion of the array 200 and the last column (column 2047) occupies the left-most portion. In this regard, the data registers 110 are preferably configured so as to hold two rows of column bit data, or 4096 bits, so that two rows of data can be written at once from data registers 110 to array 200.

Figure 3:
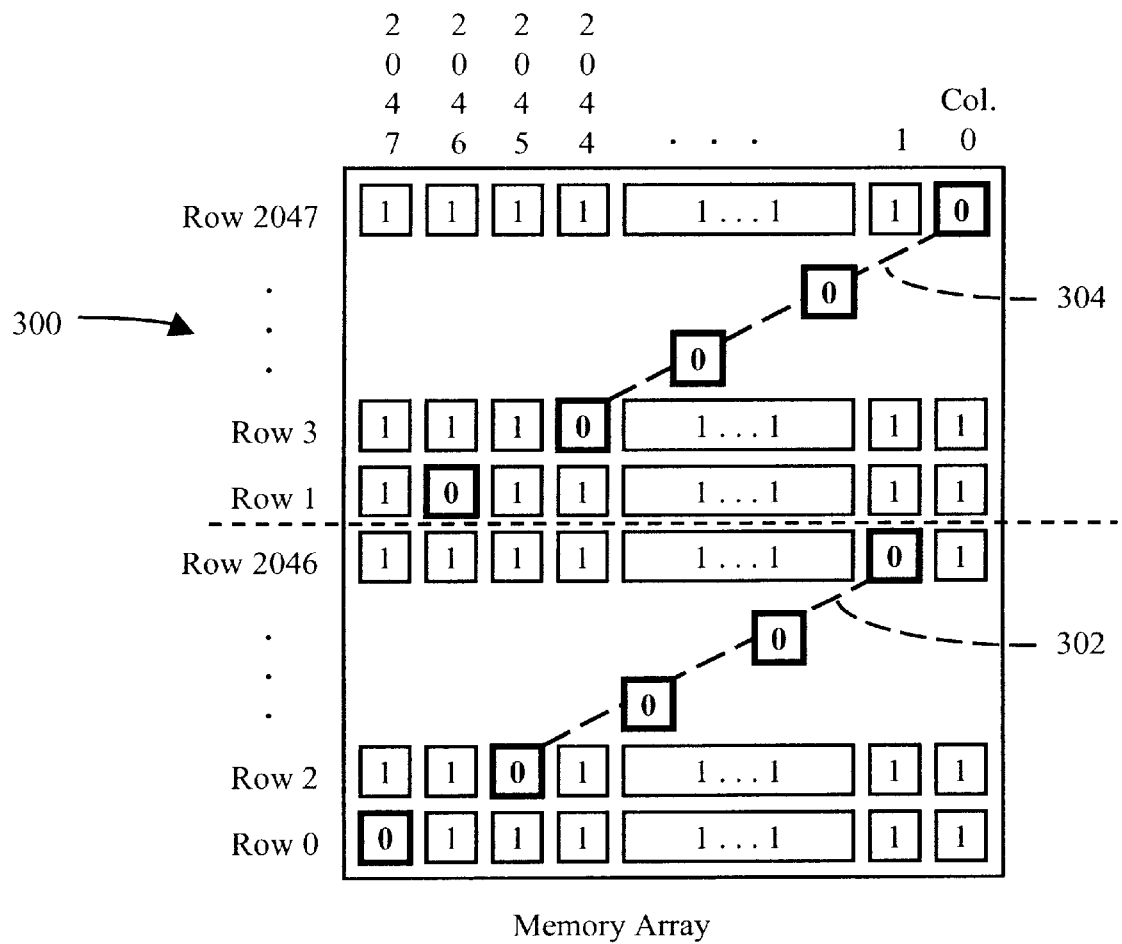
FIG. 3 is a block diagram illustrating a first test bit pattern of the present invention.

FIG. 3 illustrates a first test pattern 300 that can be used to test address decoder 112 and array 200. In test pattern 300, every row and every column have a "0" bit stored within a single memory cell, with the remaining memory cells in the row and column loaded with "1" bits. For example, in row 0, a "0" bit is present in column 2047, while columns 2046 through 0 have "1" bits therein. Similarly, in row 1, a "0" bit is present in column 2046, while columns 2047 and 2045 through 0 have "1" bits therein. The "0" bits are generally illustrated by dashed lines 302 and 304 as they extend through array 200.

Referring now to FIGS. 4A–4F, the logic employed to load array 200 with test pattern 300 will now be described. In general, an initial test bit pattern is loaded into data registers 110 and copied to the memory array 200. Subsequent test bit patterns are generated by pushing a two-bit pattern into the previous test bit pattern, as opposed to loading an entire test bit pattern into data registers 110. In this manner, the number of bits that must be loaded into data registers 110 is greatly reduced and the required test bit pattern is still generated.

Figure 4A:
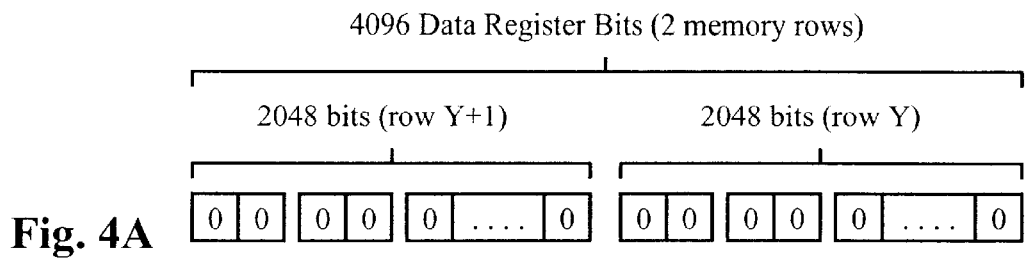
FIGS. 4A–4F illustrate the logic and data register operations of the present invention to generate the test bit pattern of FIG. 3.

In this regard, FIG. 4A generally illustrates the size and configuration of data registers 110. In the illustrated embodiment, data registers 110 are 4096 bits wide and, hence, are large enough to hold the column bit data for two rows of array 200. Hence, when the data in data registers 110 is written to array 200, it is written two rows at a time. FIG. 4A further shows data registers 110 in their initial state with "0" bits in the all of the individual registers.

Figure 4B:
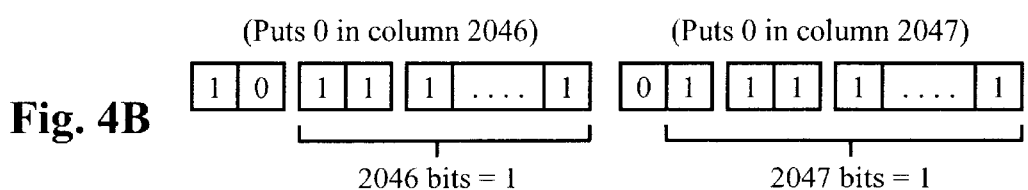

The logic begins by loading an initial test bit pattern into data registers 110. In the illustrated example, the column bit data for rows 0 and 1 are initially loaded into data registers 110. In order to generate the test pattern shown in FIG. 3, row 0 needs to have a "0" bit in column 2047 and row 1 needs to have a "0" bit in column 2046, with the remaining column bit positions in each row having "1" bits therein. In this regard, data registers 110 are serially loaded with 2,047 "1" bits, followed by a single "0" bit, followed by 2,046 "1" bits, followed by a single "0" bit, followed by a single "1" bit. FIG. 4B shows the results of this serial load operation. The contents of data registers 110 are now copied to rows 0 and 1 in array 200. As described earlier, data registers 110 retain their contents after such contents are written to array 200.

Figure 4C:
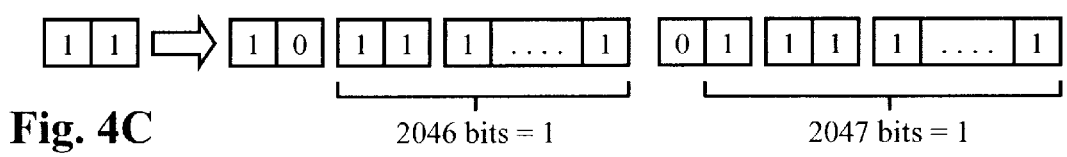
Figure 4D:
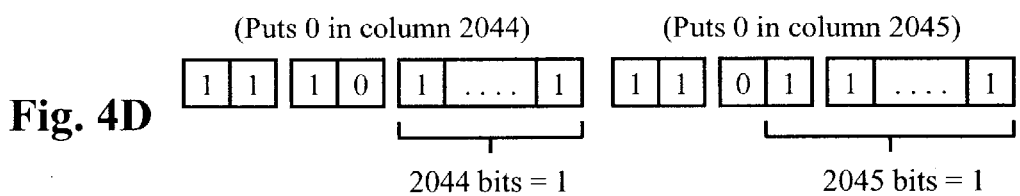

Referring now to FIG. 4C, the test bit pattern for rows 2 and 3 is generated by pushing a two-bit pattern into the data registers 110. The pushing of a two-bit pattern into data registers 110 causes the entire contents of data registers 110 to shift by two bits. In the illustrated embodiment, a two-bit pattern having two "1" bits is pushed into data registers 110. As shown in FIG. 4D, this causes the two "0" bits previously occupying columns 2046 and 2047 to shift by two bit positions so that they now occupy columns 2044 and 2045 and maintains the requirement that the remaining column bit positions have "1" bits therein by virtue of the push operation. The content of data registers 110 shown in FIG. 4D is now written to rows 2 and 3 so that row 2 has a "0" bit in column 2045 and row 3 has a "0" bit in column 2044, with the remaining column bit positions in rows 2 and 3 having "1" bits therein.

Figure 4E:
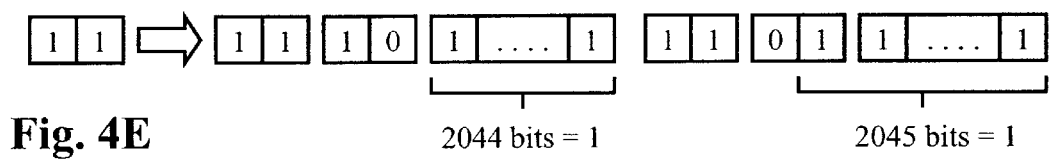
Figure 4F:
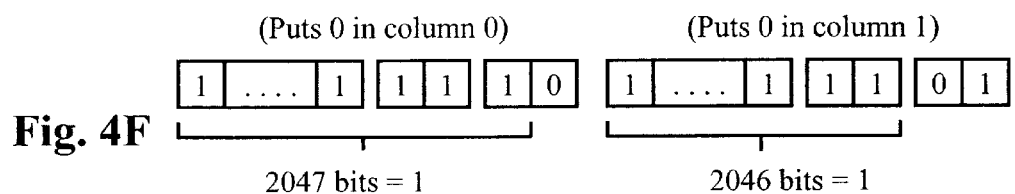

As illustrated in FIGS. 4E and 4F, the remaining test bit patterns for rows 4 through 2047 are generated in a similar fashion. That is, the two-bit pattern of two "1" bits is again pushed into data registers 110 thereby shifting the "0" bits by two bit positions. This operation of pushing the two-bit pattern of two "1" bits is repeated until the last two rows (e.g., 2046 and 2047) of array 200 have been programmed with the contents of data registers 110, as shown in FIG. 4F. At this point, array 200 is loaded with test pattern 300 of FIG. 3.

Figure 5:
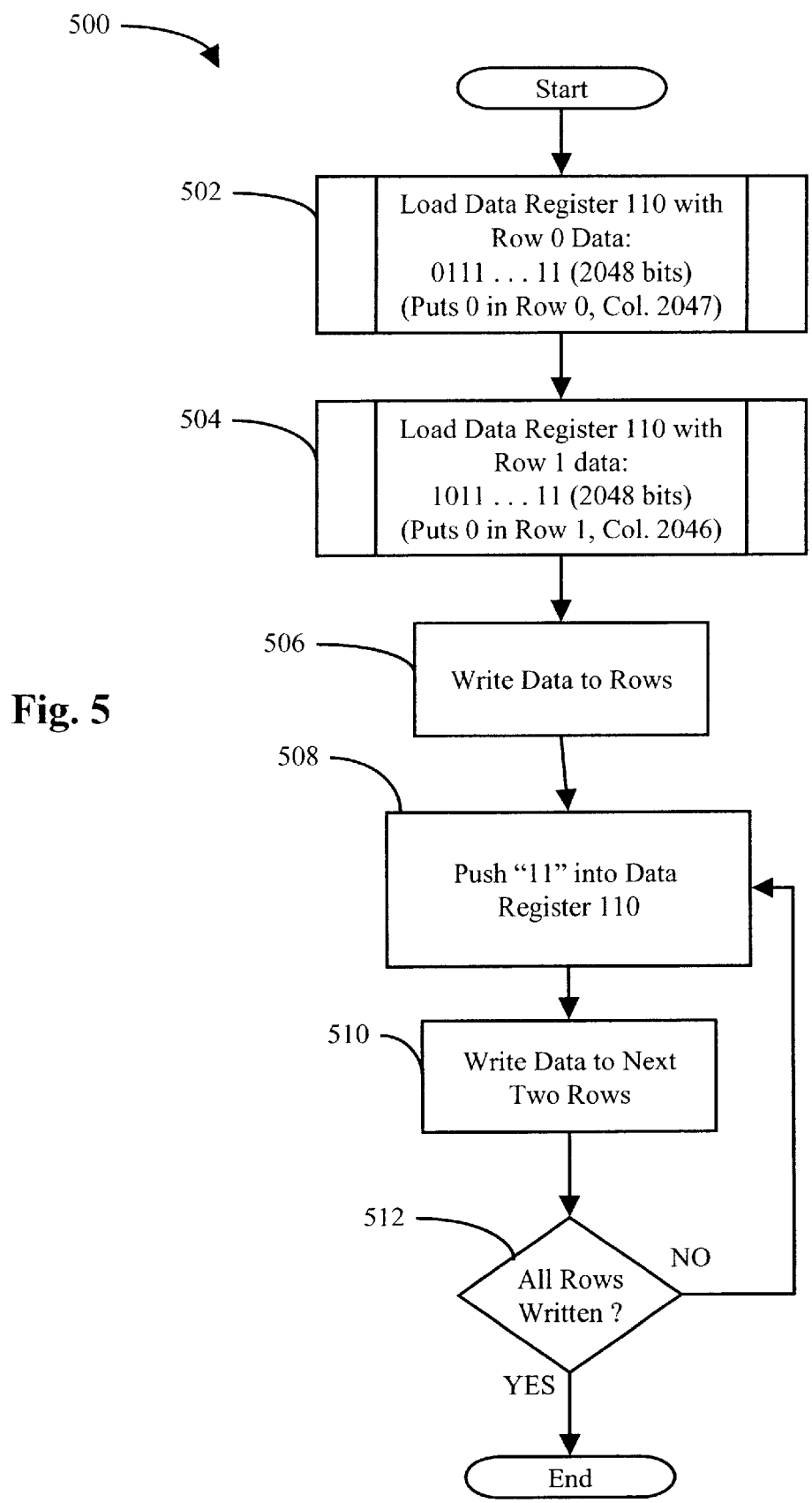
FIG. 5 is a flowchart generally illustrating the logic steps executed by a tester to generate the test bit pattern of FIG. 3.

Referring now to FIG. 5, a flowchart 500 illustrating the logic employed to load array 200 with the test bit pattern 300 of FIG. 3 is shown. The logic begins in steps 502 and 504 where data registers 110 are initially loaded with the test bit pattern data for rows 0 and 1. In particular, step 502 places a "0" bit in column 2047 and "1" bits in column 2046 through column 0 for row 0. Step 504 places a "0" bit in column 2046 and "1" bits in columns 2047 and 2045 through 0 for row 1. In step 506, the column bit data is written from data registers 110 to rows 0 and 1 of array 200. As described earlier, the contents of data registers 110 remain unchanged following a write operation to array 200.

The logic next advances to step 508, where it generates the test bit pattern for the next two rows (e.g., rows 2 and 3) to be written into array 200 by pushing a two-bit pattern having two "1" bits into data registers 110. As described earlier, this operation causes the contents of data registers 110 to shift by two bits. In this regard, the "0" bits in columns 2047 and 2046 are shifted to columns 2045 and 2044, respectively, while the remaining column bit positions have "1" bits therein by virtue of the push operation. In step 510, the newly generated test bit patterns are now written to their appropriate rows in array 200. The logic next advances to step 512 where it tests to determine if all of the rows have been written with their particular test bit pattern. If not, then the logic loops back to step 508 where the two-bit pattern of two "1" bits is once again pushed into data registers 110 to once again shift the "0" bits to their next column positions (e.g., columns 2043 and 2042), with the remaining columns having "1" bits therein. The logic continues to loop through steps 508, 510, and 512, until all of the rows have been written with their test bit patterns completing the test bit pattern of FIG. 3.

Hence, in the illustrated embodiment, it can be seen that the above logic requires only 6,142 bits to be loaded into data registers 110 to generate the required diagonal test bit patterns for array 200. More specifically, the initial test bit pattern for the first two rows loaded into the data registers 110 requires a total of 4096 bits pushed into data registers 110. In the generation of the remaining test bit patterns, two bits are pushed a total of 1023 times into data registers 110, which is a total of 2046 bits. Therefore, the combined number of bits required to be loaded into data registers 110 is only 6,142 bits. This is to be contrasted with the over 4 million bits that would have been required to be loaded into data registers 110 if each individual test bit pattern was separately generated and then loaded into data registers 110. By having to load only 6,142 bits, as opposed to over 4 million, the data loading time of the memory array is shortened by as much as 667 times. Additionally, since a loop is used to push the two-bit pattern into data registers 110, test program development time is also shortened. More specifically, two microinstructions (i.e., one for loading 4096 bits of initial data and the other for shifting two "1" bits with a counter) are needed as opposed to 1024 microinstructions that would otherwise be required. Hence, the present invention provides a method of generating a diagonal test bit pattern for testing a large memory array and its address decoder that heretofore has been difficult or even impossible to implement on testers such as the Topaz tester, HP Versatest V1100, and other similar testers.

Figure 6:
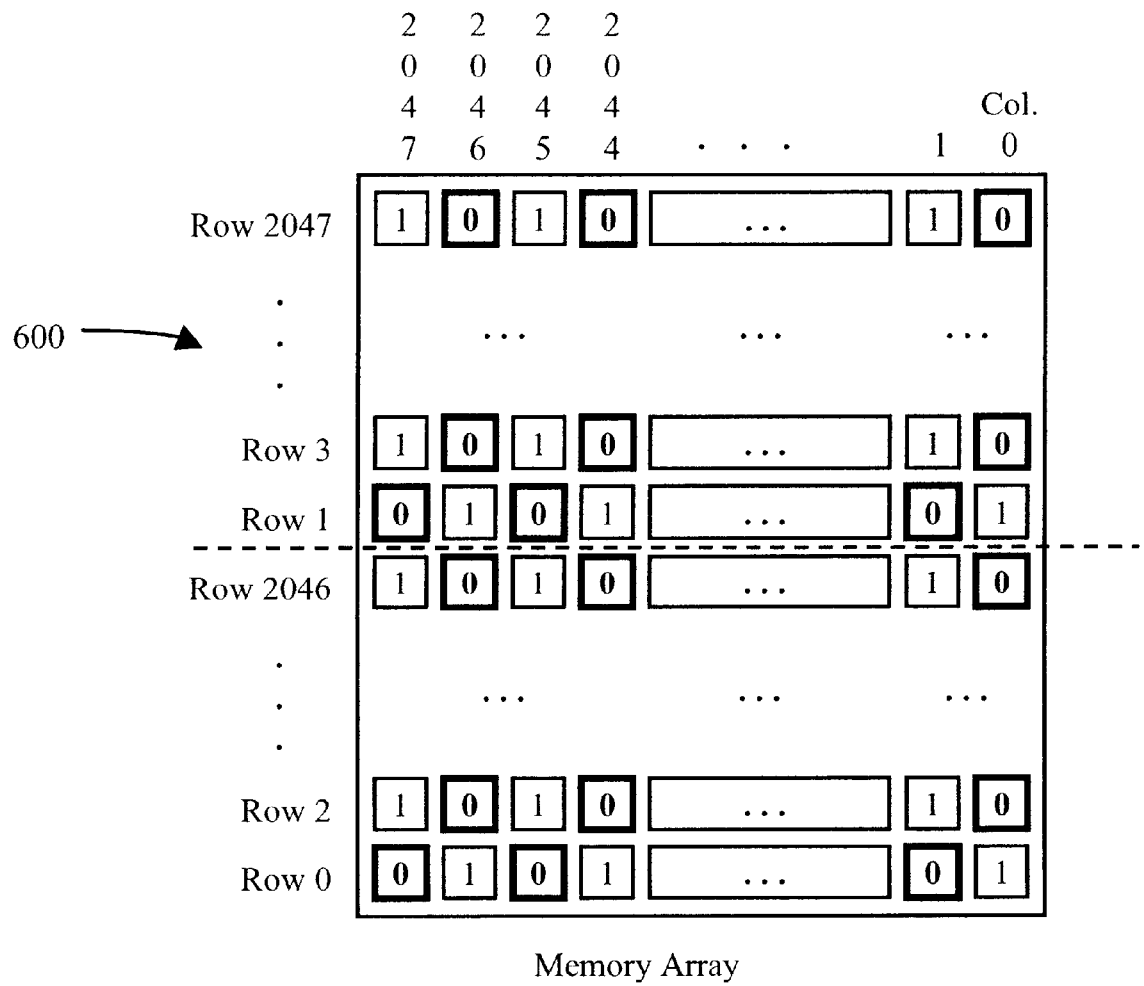
FIG. 6 is a block diagram illustrating a checkerboard test bit pattern of the present invention.

FIG. 6 illustrates a second test bit pattern 600 that can be used to test array 200. Test bit pattern 600 is sometimes referred to as a checkerboard test pattern because the rows have alternating "0" bits and "1" bits in their column bit positions. The checkerboard and checkerboard-bar (FIGS. 9–11) test patterns are used to check bit to bit shorts in the memory array. FIGS. 7A through 7H illustrate the logic employed to generate such a test bit pattern in array 200. In this regard, the logic is similar to that shown and described in connection with FIGS. 4A–4H and 5, except that the test bit patterns for the rows are generated by pushing a one-bit pattern into data registers 110 that alternates between pushing a single "1" bit and a single "0" bit to preserve the checkerboard character of the overall test bit pattern.

Figure 7A:
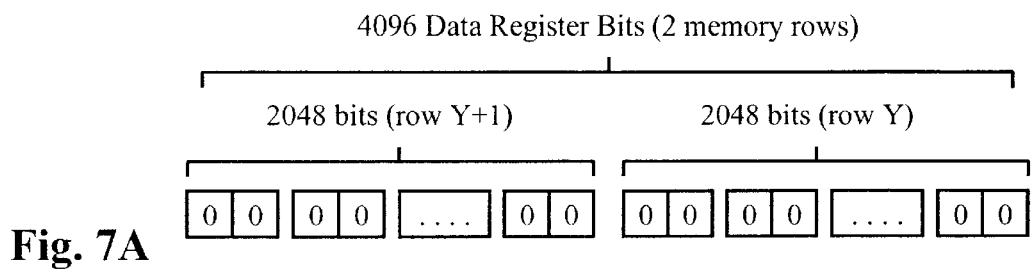
FIGS. 7A–7H illustrate the logic and data register operations of the present invention to generate the checkerboard test bit pattern of FIG. 6.

Referring now specifically to FIG. 7A, data registers 110 are 4096 bits wide and, hence, are large enough to hold the column bit data for two rows of array 200. In this regard, when the data in data registers 110 is written to array 200, it is written two rows at a time. FIG. 7A further shows data registers 110 in their initial state with "0" bits in all of the individual registers.

Figure 7B:
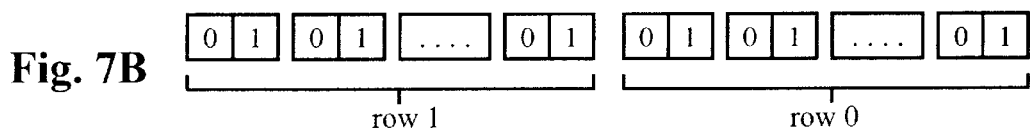

The logic begins by loading an initial test bit pattern into the registers. In the illustrated example, the column bit data for rows 0 and 1 are initially loaded into the data registers 110. In order to generate the checkerboard test pattern shown in FIG. 6, rows 0 and 1 need to have alternating "0" and "1" bits in their column bit positions. FIG. 7B shows data registers 110 loaded with the initial test bit pattern for rows 0 and 1 having alternating "0" and "1" bits, starting with a "0" bit in column 2047. The contents of data registers 110 are now written to rows 0 and 1 in array 200. As described earlier, data registers 110 retain their contents after they are written to array 200.

Figure 7C:
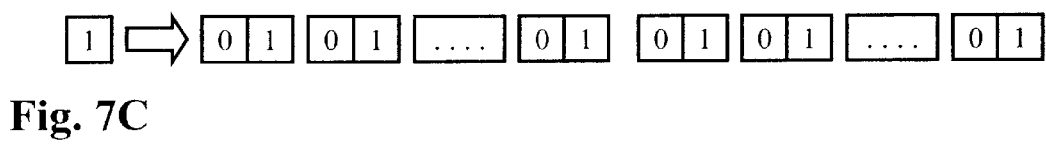
Figure 7D:
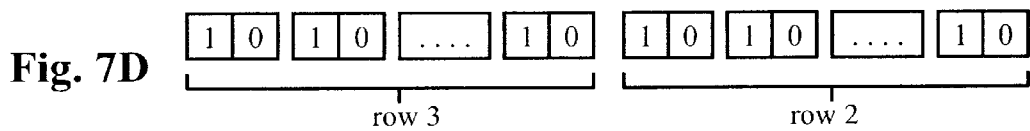

Referring now to FIG. 7C, the test bit pattern for rows 2 and 3 is generated by pushing a one-bit pattern into data registers 110. The pushing of a one-bit pattern into data registers 110 causes the entire contents of data registers 110 to shift by one bit. In the illustrated embodiment, a one-bit pattern having single "1" bit is initially pushed into data registers 110 because the previous contents of data registers 110 had a "0" bit in column bit position 2047. This is necessary to preserve the alternating configuration of "0" and "1" bits in data registers 110. As shown in FIG. 7D, this causes the alternating "0" and "1" bits to shift by one bit or column position. The contents of data registers 110 are now written to rows 2 and 3.

Figure 7E:
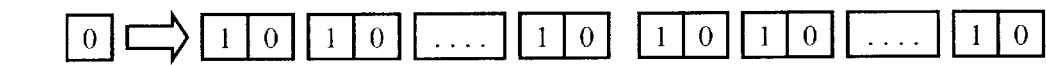
Figure 7F:
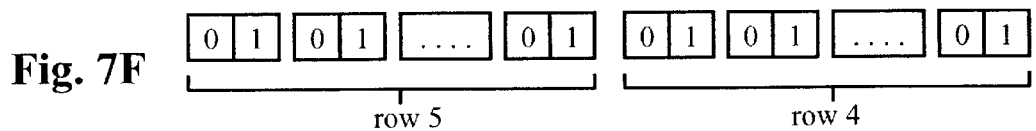

FIG. 7E illustrates the next operation, which generates the test bit pattern for rows 4 and 5. In this regard, a one bit pattern this time having a single "0" bit is pushed into data registers 110 because the previous contents of data registers 110 had a "1" bit from the earlier push operation in column bit position 2047. As described above, this is necessary to preserve the alternating configuration of "0" and "1" bits in data registers 110. As shown in FIG. 7F, this causes the alternating "0" and "1" bits to shift by yet another bit or column position while still maintaining the alternating "0" and "1" bit column configuration. The content of data registers 110 now having the newly generated test bit patterns for rows 4 and 5 are written to array 200.

Figure 7G:
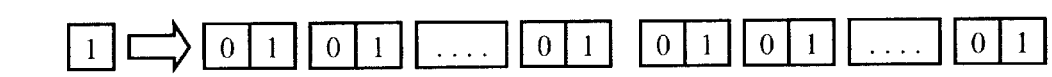
Figure 7H:
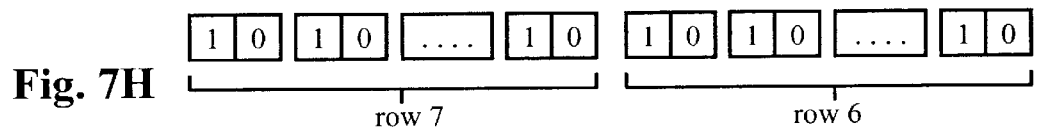

FIGS. 7G and 7H continue the logic and illustrate that by next pushing one-bit pattern having a single "1" bit into data registers 110 generates the test bit pattern for rows 6 and 7. The logic continues to loop in this manner alternately pushing single "0"and "1" bits into data registers 110 until all of the rows of array 200 have been written with their test bit patterns completing the checkerboard test pattern shown in FIG. 6.

Figure 8:
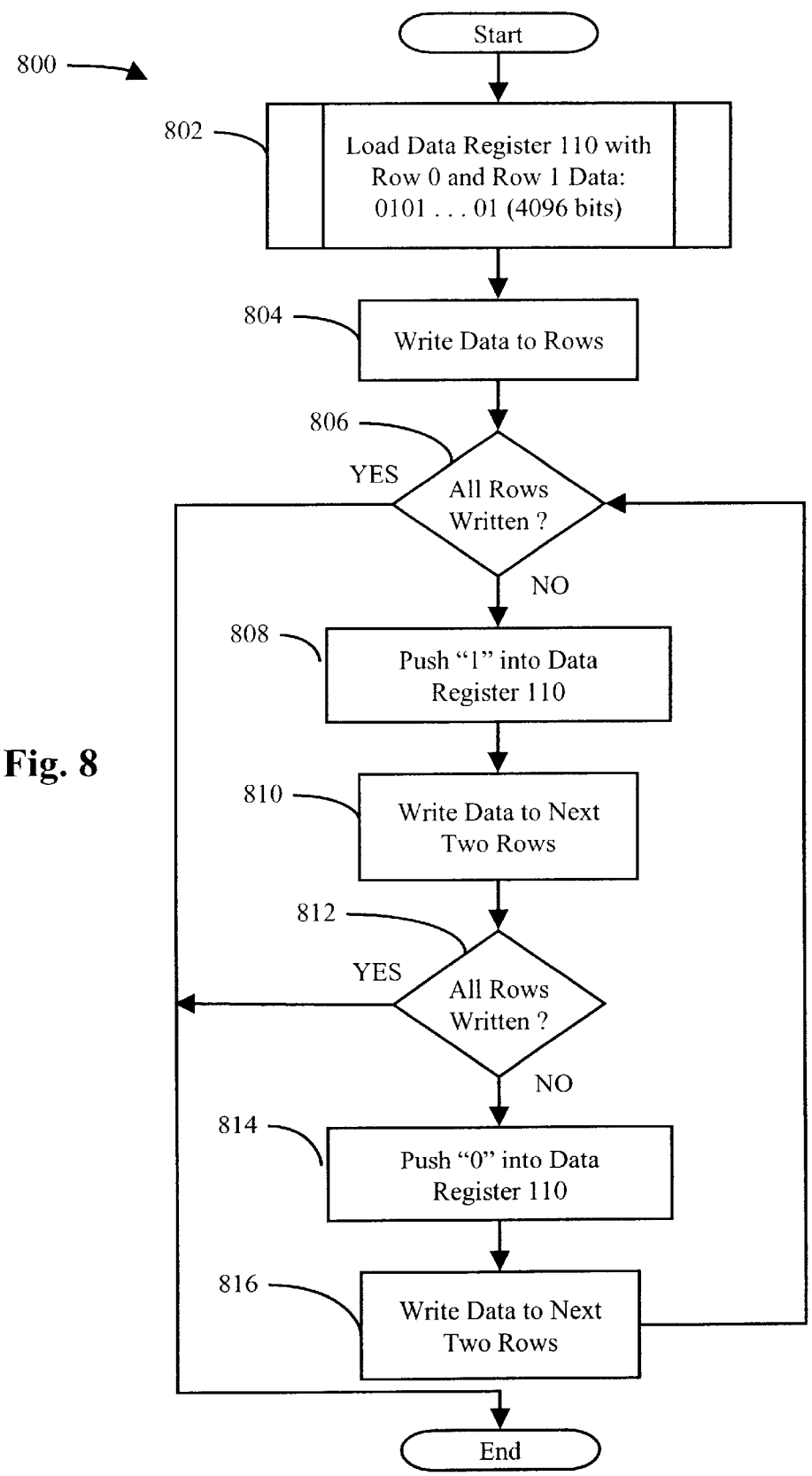
FIG. 8 is a flowchart generally illustrating the logic steps executed by a tester to generate the checkerboard test bit pattern of FIG. 6.

FIG. 8 is a flowchart 800 illustrating the logic necessary to configure array 200 with the checkerboard test bit pattern of FIG. 6. More specifically, the logic starts in step 802 where data registers 110 are loaded with the initial column bit information for rows 0 and 1. As described earlier, this involves loading data registers 110 with an alternating bit pattern of "0" and "1" bits, as shown in FIG. 7B.

In step 804, the contents of data registers 110 are written to rows 0 and 1 of array 200. In step 806, the logic tests to determine if all of the memory rows have been written with their test bit patterns. If not, the logic advances to step 808, where a one-bit pattern having a single "1" bit is pushed into data registers 110. This causes the contents of data registers 110 to shift by one bit and generate the test bit pattern for rows 2 and 3.

In step 810, the test bit pattern for rows 2 and 3 are written to array 200. The logic next tests, in step 812, to determine if there are more rows that need to be configured with test bit patterns. If yes, the logic advances to step 814 where a one-bit pattern this time having a single "0" bit is pushed into data registers 110 thereby generating the test bit pattern for the next two rows (e.g., rows 4 and 5.) Once generated, the test bit pattern is written to array 200 from data registers 110 in step 816.

After step 816, the logic loops back to step 806 to determine if there are more rows that need to be configured with test bit patterns. If so, the logic once again advances to steps 808, 810, 812, 814, and 816, where alternating one-bit patterns of single "0" bits and "1" bits are pushed into data registers 110 until all of the required test bit patterns have been generated. Hence, by pushing a one-bit pattern into data registers 110 that alternates between pushing a single "1" bit and a single "0" bit, new test bit pattern data for the rows of array 200 are generated and the checkerboard character of the overall test bit pattern is preserved.

Figure 9:
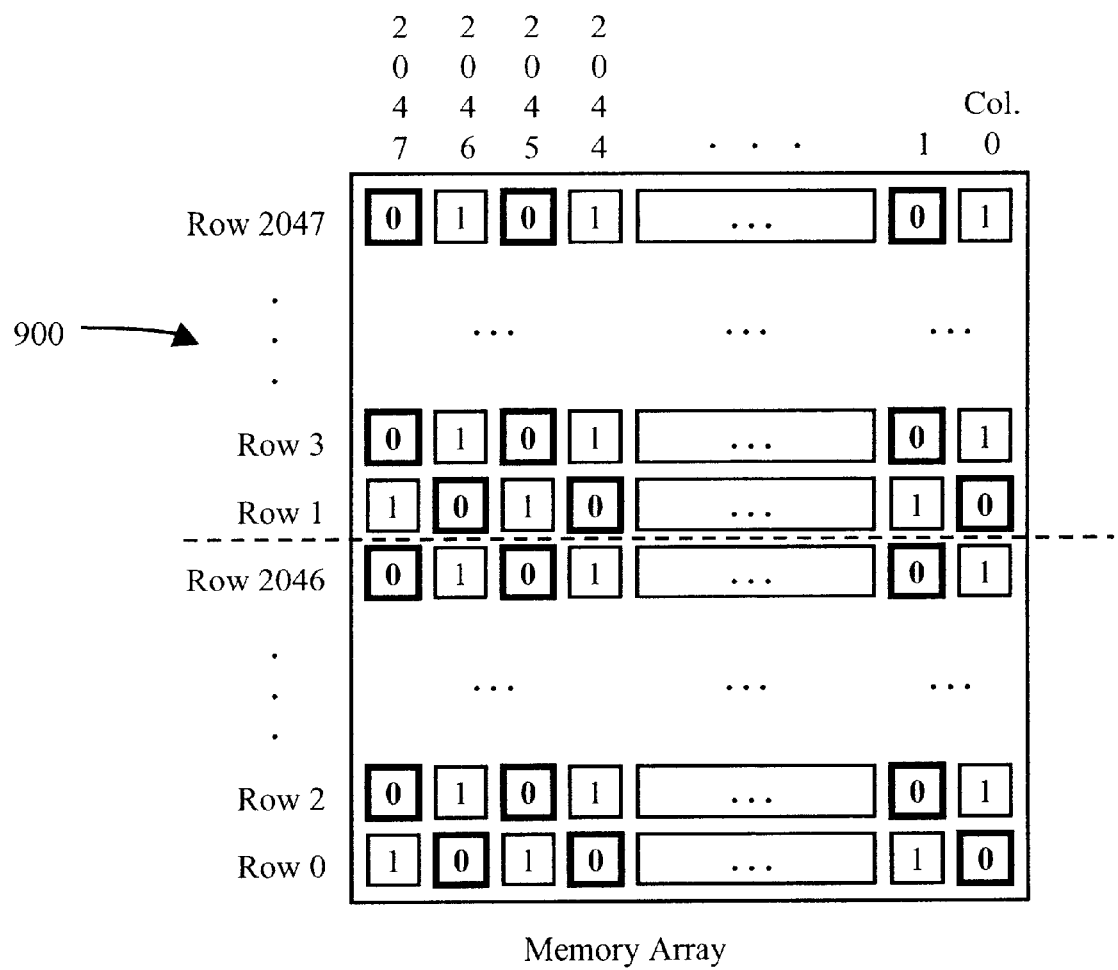
FIG. 9 is a block diagram illustrating a checkerboard-bar test bit pattern of the present invention.
Figure 10A:
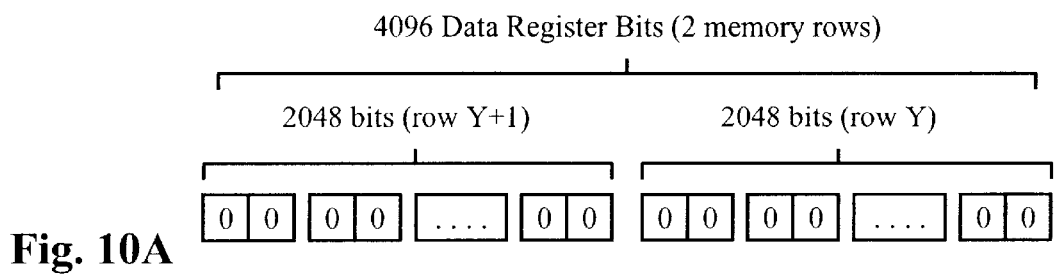
FIGS. 10A–10H illustrate the logic and data register operations of the present invention to generate the checkerboard-bar test bit pattern of FIG. 9.
Figure 10B:
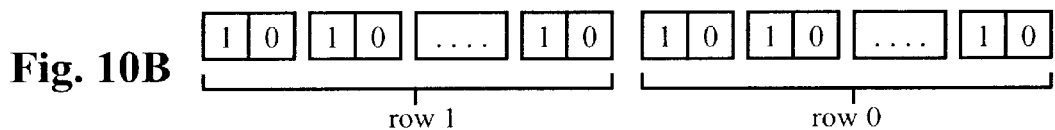
Figure 10C:
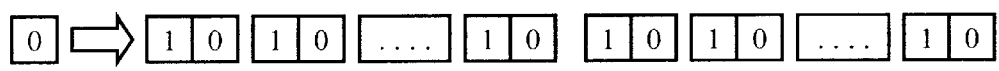
Figure 10D:
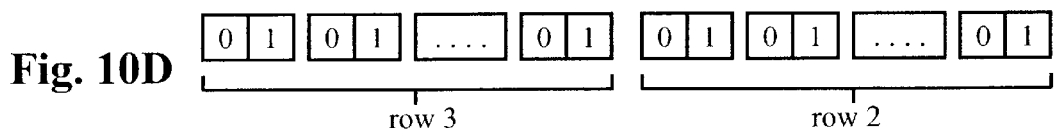
Figure 10E:
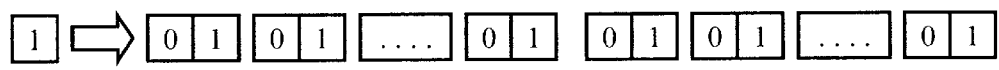
Figure 10F:
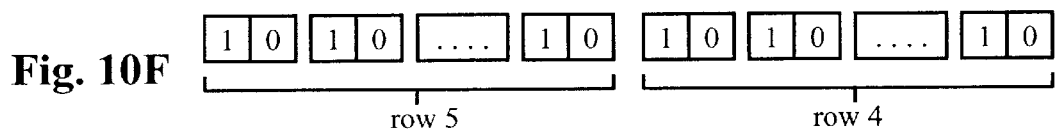
Figure 10G:
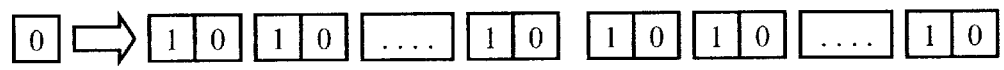
Figure 10H:
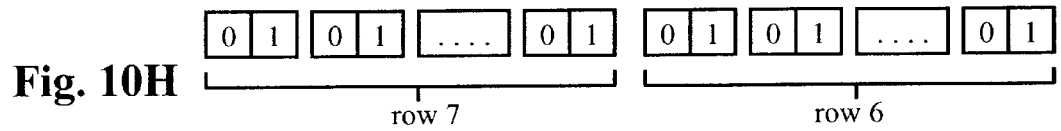
Figure 11:
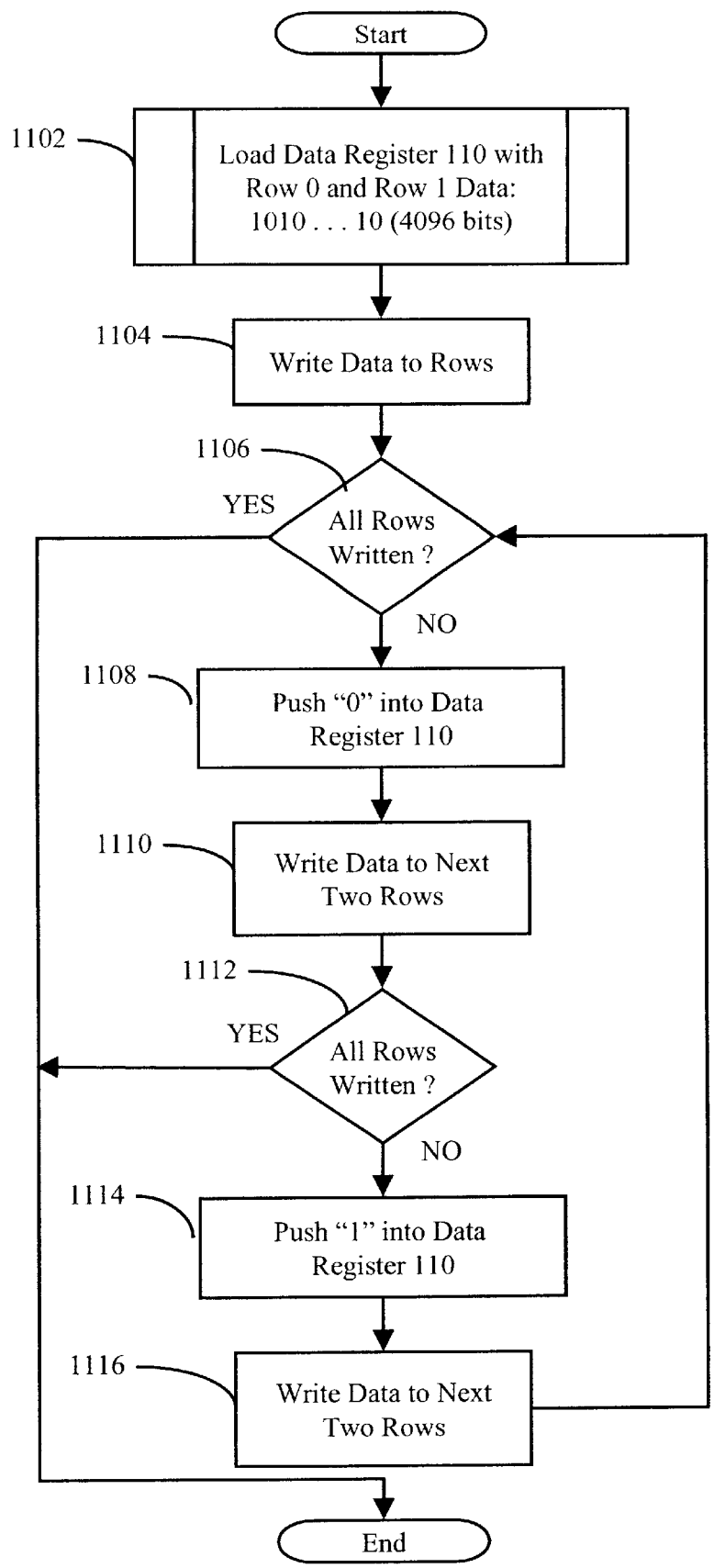
FIG. 11 is a flowchart generally illustrating the logic steps executed by a tester to generate the checker-board bar test bit pattern of FIG. 9.

FIG. 9 illustrates a checkerboard-bar test bit pattern 900 that can be used to test array 200. The checkerboard-bar test pattern 900 is similar to the checkerboard test bit pattern 600 shown in FIG. 6, except that the "0" and "1" bits have been reversed. In this regard, FIGS. 10A through 10H are similar to FIGS. 7A through 7H and illustrate the operations on data registers 110, except that the test bit pattern of "0" bits and "1" bits and the pattern of bits pushed into data registers 110 have been reversed. For example, in FIGS. 10A through 10H, the first one-bit pattern to be pushed into data registers 110 is a "0" bit, followed by a "1" bit on the next push, followed by a "0" bit on the next subsequent push, and so on. FIG. 11 is similar to FIG. 8 and shows the logic of FIGS. 10A–10H in flowchart format.

Hence, the present invention provides a method of loading a test bit pattern into a memory array. After an initial test bit pattern is loaded into a data register and copied to the memory array, subsequent test bit patterns are generated preferably by pushing a one or two-bit pattern into the previous test bit pattern. In this manner, the number of bits that must be loaded into the data register is greatly reduced and the required test bit pattern is still generated. This provides for less data bits to be loaded into the data register, allows for shorter test times since the number of operations required to load the memory with the required test bit pattern is reduced.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. For example, bit patterns greater than one or two bits can be pushed into the data registers to generate new test bit patterns. New test bit patterns for the memory array can be generated by interchanging the "0" and "1" bits of the illustrated embodiments. Additionally, data registers storing more than one or two rows worth of column bit data can be also be employed. Therefore, the invention, in its broader aspects, is not limited to the specific details, the representative apparatus, and illustrative examples shown and described. Accordingly, departures can be made from such details without departing from the spirit or scope of the applicant's general inventive concept.

I claim:

1. A method of loading a memory device with a test bit pattern, the method comprising:

loading a data register with a first test bit pattern;

storing the first test bit pattern in the memory device;

generating a new test bit pattern by pushing into the data register an additional predetermined pattern of bits comprising a predetermined number of bits and shifting the first test bit pattern by a the predetermined number of bits; and storing the new test bit pattern in the memory device.

2. The method of claim 1, wherein loading a data register comprises loading a bit pattern of a plurality of ones and at least a one zero into the data register.

3. The method of claim 1, wherein loading a data register comprises loading a bit pattern of alternating ones and zeros into the data register.

4. The method of claim 1, wherein loading a data register comprises loading a bit pattern of alternating zeros and ones into the data register.

5. The method of claim 1, wherein generating a new test bit pattern comprises shifting the first test bit pattern by at least one bit.

6. The method of claim 5, wherein generating a new test bit pattern comprises pushing alternately a single zero and a single one into the data register.

7. The method of claim 5, wherein generating a new test bit pattern comprises pushing alternately a single one and a single zero into the data register.

8. The method of claim 1, wherein generating a new test bit pattern comprises pushing into the data register an additional predetermined pattern of bits comprising at least two bits and shifting the first test bit pattern by the at least two bits.

9. The method of claim 8, wherein generating a new test bit pattern comprises pushing a two-bit pattern into the data register.

10. The method of claim 9, wherein pushing a two-bit pattern comprises pushing a two-bit pattern having two ones.

11. The method of claim 1, wherein:

the first test bit pattern comprises a plurality of ones and a single zero; and generating a new test bit pattern comprises pushing into the data register the predetermined number of ones and shifting the first test bit pattern by the predetermined number of bits.

12. A method of loading a memory device with a test bit pattern, the method comprising:

loading a data register with a first test bit pattern having a plurality of ones and at least one zero;

storing the first test bit pattern in the memory device;

generating a new test bit pattern by pushing into the data register an additional predetermined pattern of bits comprising at least one bit and shifting the first test bit pattern by the at least one bit within the data register; and storing the new test bit pattern in the memory device.

13. The method of claim 12, wherein generating a new test bit pattern comprises pushing into the data register an additional predetermined pattern of bits comprising at least two bits and shifting the first test bit pattern by the at least two bits within the data register.

14. The method of claim 13, wherein generating a new test bit pattern comprises pushing a two-bit pattern into the data register.

15. The method of claim 14, wherein pushing a two-bit pattern into the data register comprises pushing a two-bit pattern having two ones into the data register.

16. The method of claim 12, wherein generating a new test bit pattern comprises pushing a single bit into the data register.

17. The method of claim 16, wherein pushing a single bit into the data register comprises pushing alternatively a one and a zero into the data register.

18. The method of claim 12, wherein:

the first test bit pattern comprises a plurality of ones and a single zero; and generating a new test bit pattern comprises pushing into the data register the predetermined number of ones and shifting the first test bit pattern by the predetermined number of bits.

19. A method of loading a memory device having a plurality of memory cells organized by rows and columns with a test bit pattern, the method comprising:

generating a first test bit pattern by loading a data register with two rows of bit information;

storing the first test bit pattern in two rows of the memory device;

generating a new test bit pattern for two additional rows by shifting the first test bit pattern by at least two bits within the data register, wherein the step of shifting comprises pushing a predetermined two-bit pattern into the data register; and storing the new test bit pattern in the two additional rows.

20. The method of claim 19, wherein pushing a two-bit pattern into the data register comprises pushing a predetermined two-bit pattern having two ones into the data register.

21. The method of claim 20, wherein pushing a predetermined two-bit pattern into the data register comprises pushing a two-bit pattern having two zeros into the data register.

22. The method of claim 19, wherein:

the first test bit pattern comprises a plurality of ones and two zeros; and generating a new test bit pattern comprises pushing into the data register the predetermined number of ones and shifting the first test bit pattern by the predetermined number of bits.

* * * * *